United States Patent
Tsuk et al.

(10) Patent No.: US 10,565,325 B1
(45) Date of Patent: Feb. 18, 2020

(54) SYSTEMS AND METHODS FOR PARAMETER FITTING AND PASSIVITY ENFORCEMENT FOR MULTI-PORT ELECTRONIC DEVICES

(71) Applicant: Ansys, Inc., Canonsburg, PA (US)

(72) Inventors: Michael J. Tsuk, Arlington, MA (US);
Amit Hochman, Somerville, MA (US);
Jacob K. White, Belmont, MA (US)

(73) Assignee: Ansys, Inc., Canonsburg, PA (US)

( * ) Notice: Subject to any disclaimer, the term of this patent is extended or adjusted under 35 U.S.C. 154(b) by 703 days.

(21) Appl. No.: 14/797,687

(22) Filed: Jul. 13, 2015

Related U.S. Application Data

(60) Provisional application No. 62/024,150, filed on Jul. 14, 2014.

(51) Int. Cl.
*G06F 17/50* (2006.01)
*H03H 7/01* (2006.01)

(52) U.S. Cl.
CPC ...... *G06F 17/5009* (2013.01); *G06F 17/5022* (2013.01); *G06F 17/5036* (2013.01); *H03H 7/01* (2013.01)

(58) Field of Classification Search
None
See application file for complete search history.

(56) References Cited

U.S. PATENT DOCUMENTS

| | | | | | |
|---|---|---|---|---|---|
| 5,579,243 | A | * | 11/1996 | Levine | H03H 7/01 708/300 |
| 8,504,345 | B1 | * | 8/2013 | Tsuk | G06F 17/5045 703/13 |
| 9,477,792 | B1 | * | 10/2016 | Tsuk | G06F 17/5009 |
| 2007/0249350 | A1 | * | 10/2007 | Jung | H04B 1/126 455/436 |
| 2009/0195453 | A1 | * | 8/2009 | Kim | H04B 7/0417 342/373 |
| 2012/0219050 | A1 | * | 8/2012 | Zhang | H04L 25/022 375/227 |
| 2014/0146862 | A1 | * | 5/2014 | Aubert | H04L 25/0242 375/224 |

OTHER PUBLICATIONS

Y. S. Mekonnen, "Broadband Macromodeling Techniques for Interconnects and Electronic Packages", pp. 1-121, 2007 i.*

(Continued)

*Primary Examiner* — Kibrom K Gebresilassie
(74) *Attorney, Agent, or Firm* — Jones Day

(57) ABSTRACT

Systems and methods are provided for simulating an electrical characteristic of an electronic device having input ports and output ports. A device frequency response data structure is accessed that contains data associated with a plurality of port-to-port frequency responses of the electronic device, each port-to-port frequency response being associated with a plurality of frequencies. A QR decomposition is performed based on data from the frequency response data structure. A subset of the port-to-port frequency responses is selected based on the QR decomposition. A set of common poles is identified using the selected subset of port-to-port frequency responses, and a model of time domain behavior of the electronic device is generated using the set of common poles.

20 Claims, 8 Drawing Sheets

(56) References Cited

OTHER PUBLICATIONS

Y. S. Mekonnen, "Broadband Macromodeling Techniques for Interconnects and Electronic Packages", pp. 1-121, 2007.*
Y. S. Mekonnen, "Broadband Macromodeling Techniques for Interconnects and Electronic Packages", pp. 1-121. (Year: 2007).*
Mekonnen et al, "Broadband Macromodeling Techniques for interconnect and electronic Package", pp. 1-121, 2007. (Year: 2007).*

* cited by examiner

SYSTEMS AND METHODS FOR PARAMETER FITTING AND PASSIVITY ENFORCEMENT FOR MULTI-PORT ELECTRONIC DEVICES

CROSS-REFERENCE TO RELATED APPLICATIONS

This application claims priority to U.S. Provisional Application No. 62/024,150, filed Jul. 14, 2014, entitled "Systems and Methods for Parameter Fitting and Passivity Enforcement for Multi-Port Electronic Devices," the entirety of which is herein incorporated by reference.

This application is related to U.S. patent application Ser. No. 13/763,273, filed Feb. 8, 2013, entitled "Enhancements to Parameter Fitting and Passivity Enforcement," and U.S. Pat. No. 8,504,345, filed Oct. 13, 2009, entitled "State-Space Model-Based Simulators and Methods," the entirety of both of which is herein incorporated by reference.

FIELD

This disclosure is related generally to electronics simulation and more particularly to simulation of multi-port electronic devices.

BACKGROUND

Measurement and simulation strategies for characterizing a response of a given structure to an input (e.g., the electrical behavior of interconnect and packaging structures for electronic circuits, electromagnetic behavior of antenna structures) often utilizes a frequency-domain approach. Such an approach is equivalent to applying sinusoidal excitations to the terminals or ports of the electronic device and then measuring the response at other ports. The relation between the excitations and the responses, and how those relations vary with frequency, are used to calculate scattering parameters. For a structure with p ports measured at $n_f$ frequencies (e.g., hundreds or thousands of different frequencies), the scattering (or S-) parameter data is a set of $n_f$ matrices, where each matrix is a set of p×p complex numbers. The entry in the $i^{th}$ row and $j^{th}$ column of the matrix associated with a particular frequency f indicates how a sinusoidal excitation with frequency f applied to port j will affect the response at port i.

SUMMARY

Systems and methods are provided for simulating an electrical characteristic of an electronic device having input ports and output ports. A device frequency response data structure is accessed that contains data associated with a plurality of port-to-port frequency responses of the electronic device, each port-to-port frequency response being associated with a plurality of frequencies. A QR decomposition is performed based on data from the frequency response data structure. A subset of the port-to-port frequency responses is selected based on the QR decomposition. A set of common poles is identified using the selected subset of port-to-port frequency responses, and a model of time domain behavior of the electronic device is generated using the set of common poles.

DETAILED DESCRIPTION

Simulators, which are typically used to compute the time evolution of voltages, currents, and electromagnetic fields in structures, often require accurate representations of the structure being simulated in the time domain. For this reason, a simulator may include a module for converting S-parameter frequency domain representations of electronic devices or systems into models that are suitable for time-domain simulation.

For example, such time domain representations can be generated by constructing a p-input, p-output system of linear differential equations whose response to sinusoid excitations closely matches the responses represented by the corresponding S-parameter data. However, the generation of such a representation can be computationally cumbersome and is prone to inaccuracies, especially when the S-parameter data is inexact, such as when it is contaminated with measurement noise or field solver numerical errors.

U.S. patent application Ser. No. 13/763,273, filed Feb. 8, 2013, entitled "Enhancements to Parameter Fitting and Passivity Enforcement," incorporated by reference in its entirety herein above, describes a process for generating a model of time-domain behavior of an electronic circuit from an S-parameter representation. The process described in that application seeks to fit the frequency response of a time-domain state space model to a given S-parameter table that represents theoretical or measured behavior of the electronic device. A subset of the S-parameter table is used to identify a set of common poles. Each port-to-port transfer function in the S-parameter table (e.g., as stored in the $n_f \times 1$ array containing the frequency responses from port j to port i for each of frequencies $n_1$ to $n_f$) is fit independently, such as via a least-squares algorithm with regularization, to estimate transfer-function-specific residues for the common poles. In one example, the residues are then adjusted to achieve energetic consistency (e.g., passivity, where the energy at the output according to the set of transfer functions is no more than the energy at the input) while minimizing the impact on fit error to generate a model of time-domain behavior of the electronic device. Submitted herein are descriptions of improvements to certain of these processes for generating a simulation model.

Figure 1:
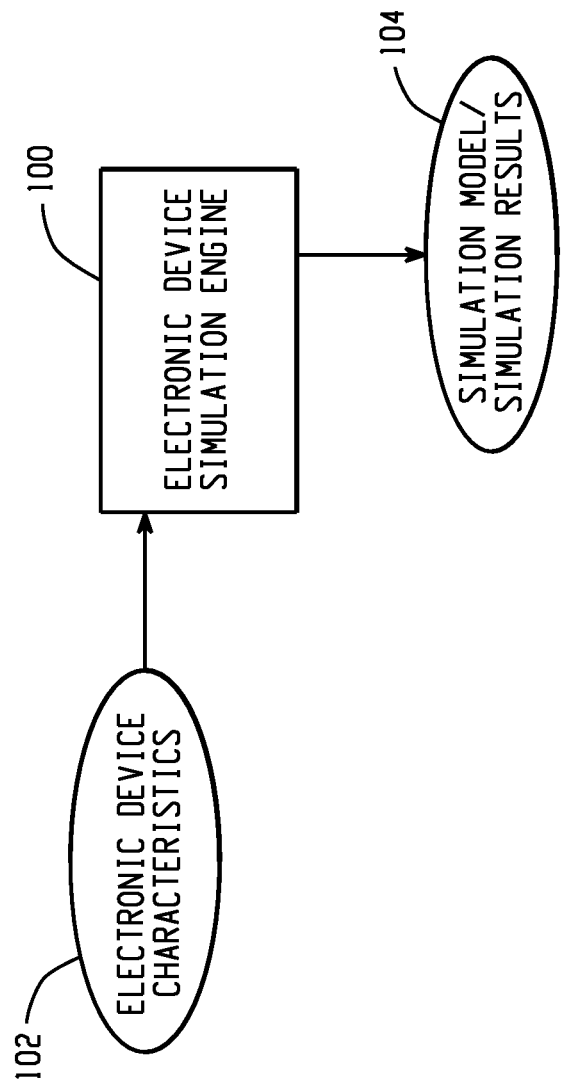
FIG. 1 is a block diagram depicting an electronic device simulation engine.

FIG. 1 is a block diagram depicting an electronic device simulation engine. The electronic device simulation engine 100 receives characteristics 102 of an electronic device. In one embodiment those characteristics are in the form of a data structure containing S-parameter matrix data that describes the frequency response of the electronic device. In another embodiment, the characteristics 102 provide parameters of the electronic device from which the S-parameter data is simulated or otherwise extracted. Based on the electronic device characteristics 102, the electronic device simulation engine 100 generates a simulation model and/or simulations results that represent the electronic device that is outputted at 104.

Figure 2:
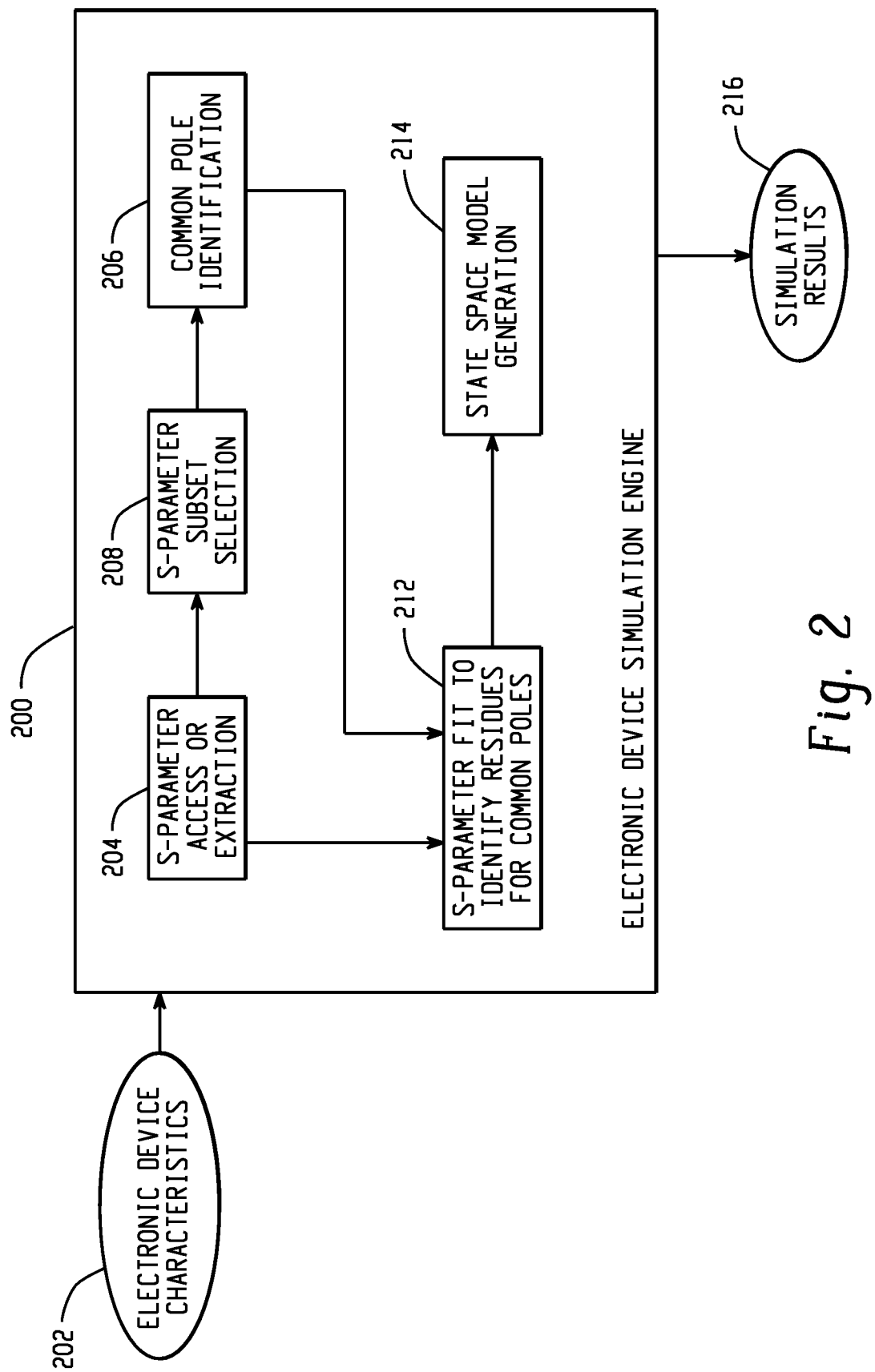
FIG. 2 is a flow diagram depicting example operations of an electronic device simulation engine.

FIG. 2 is a flow diagram depicting example operations of an electronic device simulation engine. An electronic device simulation engine 200 receives characteristics 202 of an electronic device. A p-port device can be specified as a table of S-parameter matrices at $n_f$ frequencies. Such data is extracted from the electronic device characteristics 202 at 204 or supplied to the engine 200 at 202 and accessed at 204. In one example, that data is stored as a three-dimensional matrix. That matrix is p-high with the $i^{th}$ row-slice associated with the $i^{th}$ output port, it is p-wide, with the $j^{th}$ column-slice associated with the $j^{th}$ input port, and $n_f$ deep, with the $k^{th}$ pillar-slice associated with the $k^{th}$ tabulated frequency. The $k^{th}$ pxp pillar-slice is the scattering parameter matrix at the $k^{th}$ frequency, denoted $S(f_k)$. The $n_f$-long vector in depth direction, the pillar associated with row i and column j, is the tabulated transfer function from input port j to output port i, denoted $S_{i,j}$.

At 206, the electronic device simulation engine 200 estimates common poles of the S-parameter matrix. While the entirety of the S-parameter matrix can be used for pole estimation at 206, the S-parameter matrix includes significant amounts of redundant information, where the poles can be estimated using less than the entirety of the S-parameter matrix. Thus, at 208, a selection is made of a subset of the S-parameter matrix for use in common pole evaluation at 206, with an example of that subset selection being described in further detail with regard to FIG. 3.

The common poles and the S-parameter matrix are provided to module 212, where each port-to-port transfer function in the S-parameter table (e.g., as stored in the $n_f$×1 array containing the frequency responses from port j to port i for each of frequencies $n_1$ to $n_f$) is fit independently, such as via a least-squares algorithm with regularization, to estimate transfer-function-specific residues for the common poles. In one example, each of port-to-port transfer function is fit to the same tolerance of fit, where once that fit meets the tolerance threshold, further fitting is ceased. In one example, different port-to-port transfer functions are fit to different tolerances. In one example, the tolerance for each port-to-port transfer function is determined based on a sensitivity analysis, as described in further detail with respect to FIGS. 4 and 5. At 214, the fits determined at 212 are used to generate a model, such as a state space model of the behavior of the electronic device, where that model is used to generate simulation results 216 of an electrical characteristic of the electronic device, which can be stored in a computer-readable medium.

Figure 3:
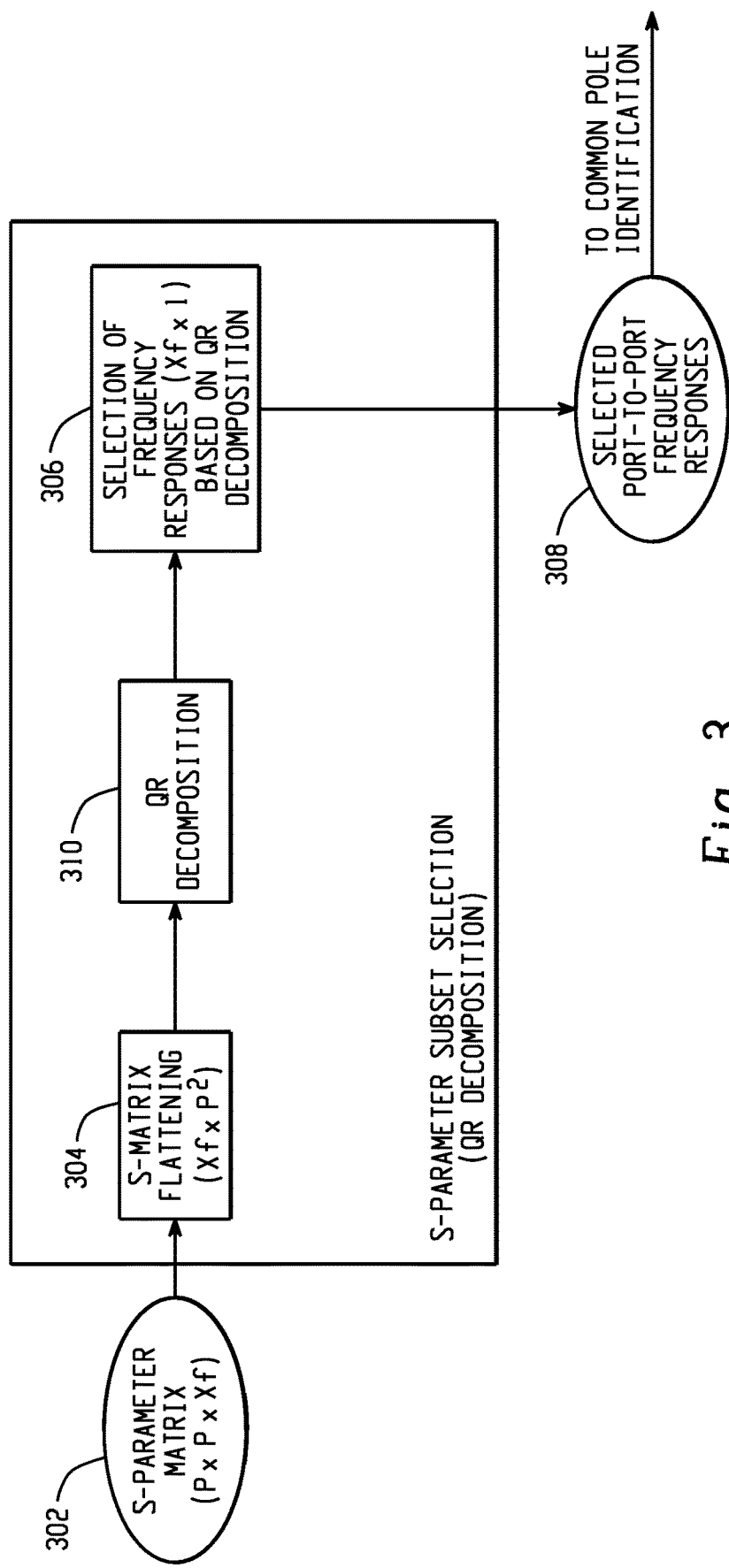
FIG. 3 is a block diagram depicting example details of a selection of a subset of the S-parameter matrix for use in identifying common poles.

FIG. 3 is a block diagram depicting example details of a selection of a subset of the S-parameter matrix for use in identifying common poles. S-parameter matrix data 302 is received, where that data is representative of a p by p by $x_f$ matrix, where p is the number of ports of the electronic device. When estimating common poles, in one example, the S-parameter matrix is adjusted to represent $p^2$ independent transfer functions, each of which is tabulated at $n_f$ points. That is the pxpx$n_f$ three-dimensional matrix S is flattened into a two-dimensional matrix $S_{flat}$, with $n_f$ rows and $p^2$ columns, where each column is a transfer function. Such flattening is performed at 304. At 306, the engine identifies a minimal set of columns of $S_{flat}$ that accurately characterizes all of the columns of the S-parameter matrix, where that set of columns is outputted at 308 for common pole identification.

In one embodiment, the selection of columns at 306 is based on a QR decomposition process performed at 310. The QR decomposition with pivoting identifies a Q matrix and an R matrix, where:

$$S_{flat}=QR,$$

where Q is an $n_f$×$p^2$ matrix with unit-length ordered mutually orthogonal columns and R is an upper triangular matrix whose diagonals are decreasing with index. The example QR pivoting algorithm at 310 shuffles the column ordering between Q and $S_{flat}$, with the $j^{th}$ column of Q being associated with a unique $j^{th}$ column of $S_{flat}$. That is $Q_{i,j} \cdot R_{j,j}$ is an estimate of error at frequency i incurred by trying to represent the $j^{th}$ column of $S_{flat}$ with a weighted combination of the first j–1 columns of Q. Thus, the following algorithm can be used to determine which columns of $S_{flat}$ should be selected for common pole estimation.

1. Form QR=$S_{flat}$ and record the pivoting order;
2. Determine the smallest $j_0$ such that $Q_{i,j} R_{j,j}$<selectTolerance for all i in $\{1, \ldots, n_f\}$, j>$j_0$;
3. Use the recorded pivoting order to determine the $j_0$ columns of $S_{flat}$ to use in common pole estimation, where selectTolerance is set smaller than the desired fit accuracy.

With reference back to FIG. 2, the selected port-to-port frequency responses are utilized at 206 to determine common poles from the subset of transfer functions, such as using the Loewner-matrix based approach described in U.S. patent application Ser. No. 13/763,273, filed Feb. 8, 2013, entitled "Enhancements to Parameter Fitting and Passivity Enforcement," incorporated by reference above. At 212, in one embodiment, all of the columns of the $S_{flat}$ are fit, such as using the least-squares algorithm with regularization described in the above identified application. In one example, if the fitting error (e.g., $S_{flat-error}=S_{flat}-S_{flat-fix}$) is too large, then the selection algorithm and common pole identification at 206, 208 is repeated, with $S_{flat-error}$ replacing $S_{flat}$. The common poles are redetermined, the columns of $S_{flat}$ are refit, and $S_{flat-error}$ is recomputed, with the process being repeated until $S_{flat-error}$ meets the desired accuracy criteria or until the selection algorithm fails to produce an additional unused column.

Figure 4:
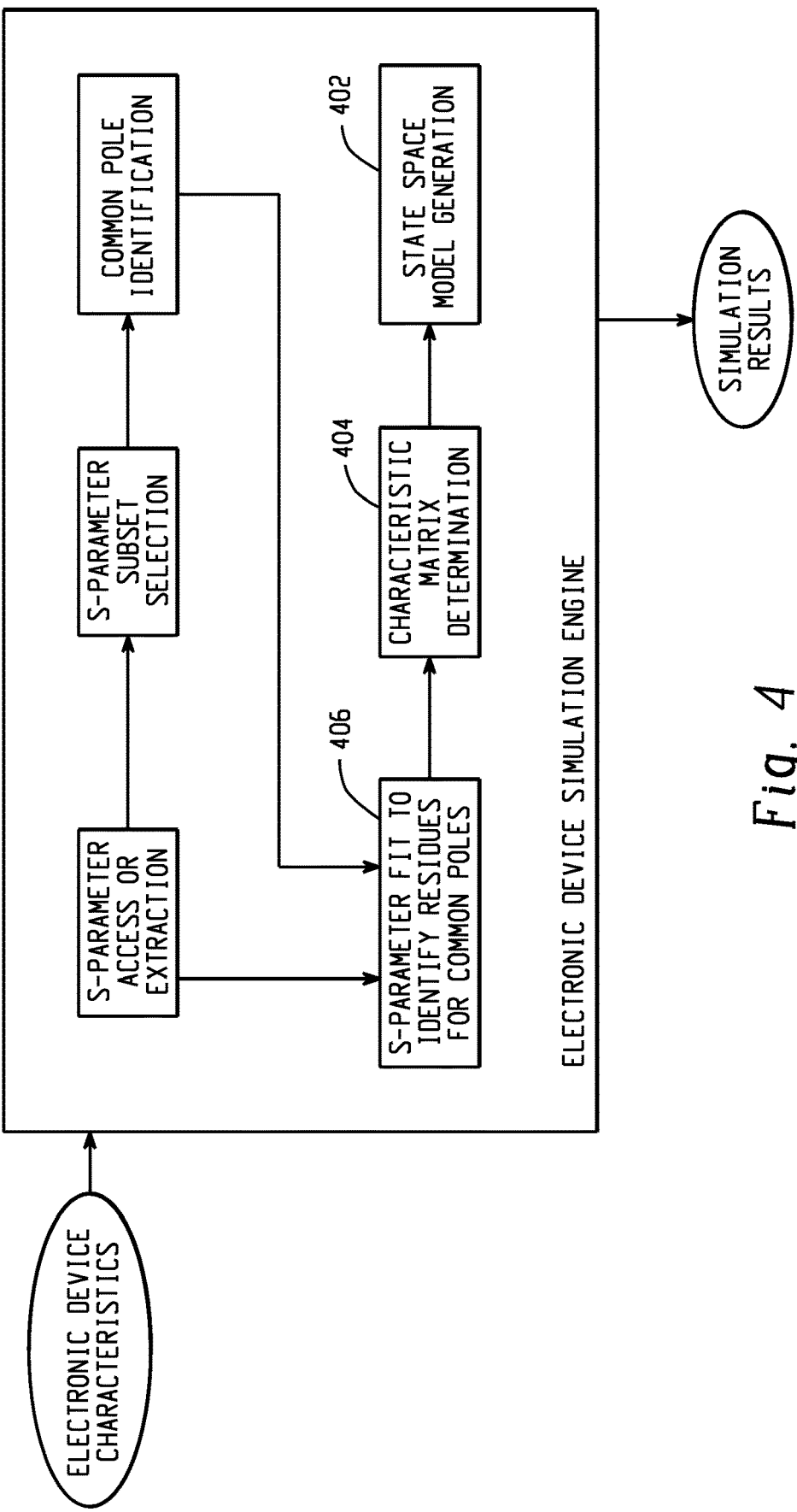
FIG. 4 is a block diagram depicting another exemplary process for generating a simulation model for simulating an electrical characteristic of an electronic device.

FIG. 4 is a block diagram depicting another exemplary process for generating a simulation model for simulating an electrical characteristic of an electronic device. In generating a model of an electronic device, such as the state space model generated at 402, in one embodiment, a characteristic matrix, representative of a time-domain characteristic of the electronic circuit is generated at 404. For example, the characteristic matrix may take the form of an impedance, Z, matrix or an admittance, Y, matrix. The characteristic matrix is generated at 404 based on the S-parameter fits of port-to-port frequency responses at 406. In one example, the characteristic matrix generated at 404 is more sensitive to fit errors for certain port-to-port frequency responses than others. In order to increase quality of the characteristic matrix determination 404, port-to-port frequency responses to which the characteristic matrix 404 is more sensitive are fit to a tighter tolerance at 406, improving the characteristic matrix generated. In one example, each port-to-port frequency response is assigned an individual fit tolerance to be applied at 406 based on a sensitivity determination that measures a susceptibility of the characteristic matrix to degradation based on errors in particular port-to-port frequency response fits.

Figure 5:
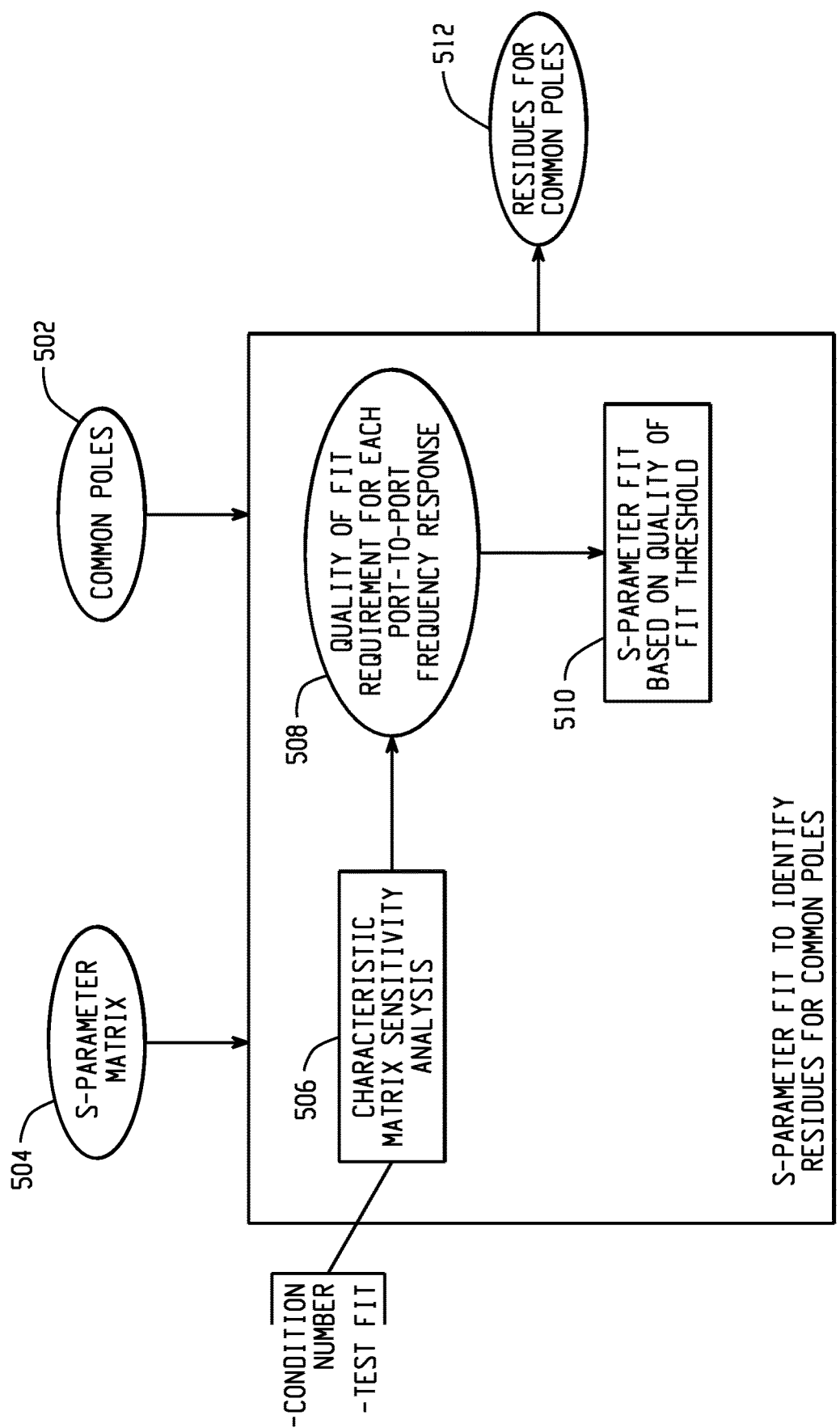
FIG. 5 is a block diagram depicting example steps of performing S-parameter fits for port-to-port frequency responses having differing fit tolerances.

FIG. 5 is a block diagram depicting example steps of performing S-parameter fits for port-to-port frequency responses having differing fit tolerances. A set of identified common poles 502 and an S-parameter matrix 504 containing a set of port-to-port frequency responses are received. At 506, a sensitivity analysis is performed to identify a sensitivity of a characteristic matrix to be generated to fit errors of port-to-port frequency responses contained in the S-parameter matrix. The sensitivity analysis at 506 is used to identify a quality of fit requirement 508 for each port-to-port frequency response. For example, for a port-to-port frequency response fit to which the characteristic matrix is not very sensitive, the tolerance for fit errors 508 may be high. In contrast, for a port-to-port frequency response fit to which the characteristic matrix is very sensitive, the tolerance for fit errors 508 is set much lower. At 510, the S-parameter matrix is used to generate port-to-port frequency response fits that meet the quality of fit requirement 508 to determine the residues 512 for the common poles.

The sensitivity analysis at 506 can be performed in a variety of manners. In one example, the frequency sensitivity of a characteristic matrix Z to fitting errors of a port-to-port frequency response fit is represented as:

$$W_{zs}(f_k) \equiv \frac{\|Z_{fit}(f_k) - Z(f_k)\|}{\|S_{fit}(f_k) - S(f_k)\|},$$

where $W_{zs}(f_k)$ is a real positive number that is associated with the frequency-dependent sensitivity of the error metric in Z to the error metric in S. This suggests that the error metric in Z will remain small if $\|S_{fit}(f_k) - S(f_k)\| \leq \text{tolerance} \cdot W_{zs}(f_k)$. That is, fitting errors in S at frequency $f_k$ should be inversely proportional to the Z sensitivity to errors in S. Because the relationship between Z and S includes the term $(1-S(f_k))^{-1}$, a term that can peak sharply at certain frequencies when S describes a low-loss device, $$\frac{\delta Z}{\delta S}(f_k)$$

can be strongly frequency dependent, its dynamic range often exceeding several orders of magnitude. A parallel analysis follows for estimating errors in Y, the admittance matrix, where the sensitivity of errors in Y to errors in S, $$W_{ys}(f_k) \equiv \frac{\delta Y}{\delta S}(f_k),$$

can also have a wide dynamic range.

The error tolerance weighting factor can be utilized in a variety of fashions in fitting each port-to-port frequency response to identify residues for the common poles. In one example, the weighting factors are used in a least-squares algorithm for finding A and B matrices from Loewner matrix right singular vectors. In another example, the error tolerance used in an iterative algorithm for determining the number and location of the common poles is converted based on the weight. In a third example, the regularized least-squares algorithm is weighted for fitting individual transfer functions using the weighting factor. Further, the error tolerance used to control error growth in the iterative passivity enforcement algorithm can be converted based on the weighting factor.

The frequency-dependent relationship between errors in a characteristic matrix (e.g., Z or Y) and errors in S can be estimated in one of multiple ways. One method is based on matrix perturbation theory, where a weighting factor is determined according to:

$$W_{zs}(f_k) \equiv \frac{\delta Z}{\delta S}(f_k) \approx cond(I - S(f_k)) \text{ or}$$

$$W_{ys}(f_k) \equiv \frac{\delta Y}{\delta S}(f_k) \approx cond(I + S(f_k)),$$

where $cond(I-S(f_k))$ is the condition number of $I-S(f_k)$, the ratio of $I-S(f_k)$'s largest and smallest singular values. The matrix condition number can be computed directly from the given S-parameter table, making it an attractive option for identifying sensitivities. However, it is a worst-case local estimate of the ratio of sum-of-squares perturbation and may be more restrictive that is strictly necessary.

An alternative method uses a test unweighted fit. A fit to S is generated, denoted as $S_{testFit}$, and a $Z_{testFit}$ computed from $S_{testFit}$ (e.g., as described herein above). The frequency-dependent sensitivity is then determined using the ratio of error metrics as:

$$W_{zs}(f_k) \approx \frac{\|Z(f_k) - Z_{testfit}(f_k)\|}{\|S(f_k) - S_{testfit}(f_k)\|},$$

with $W_{ss}(f_k)$ set to a minimum value of one.

Figure 6:
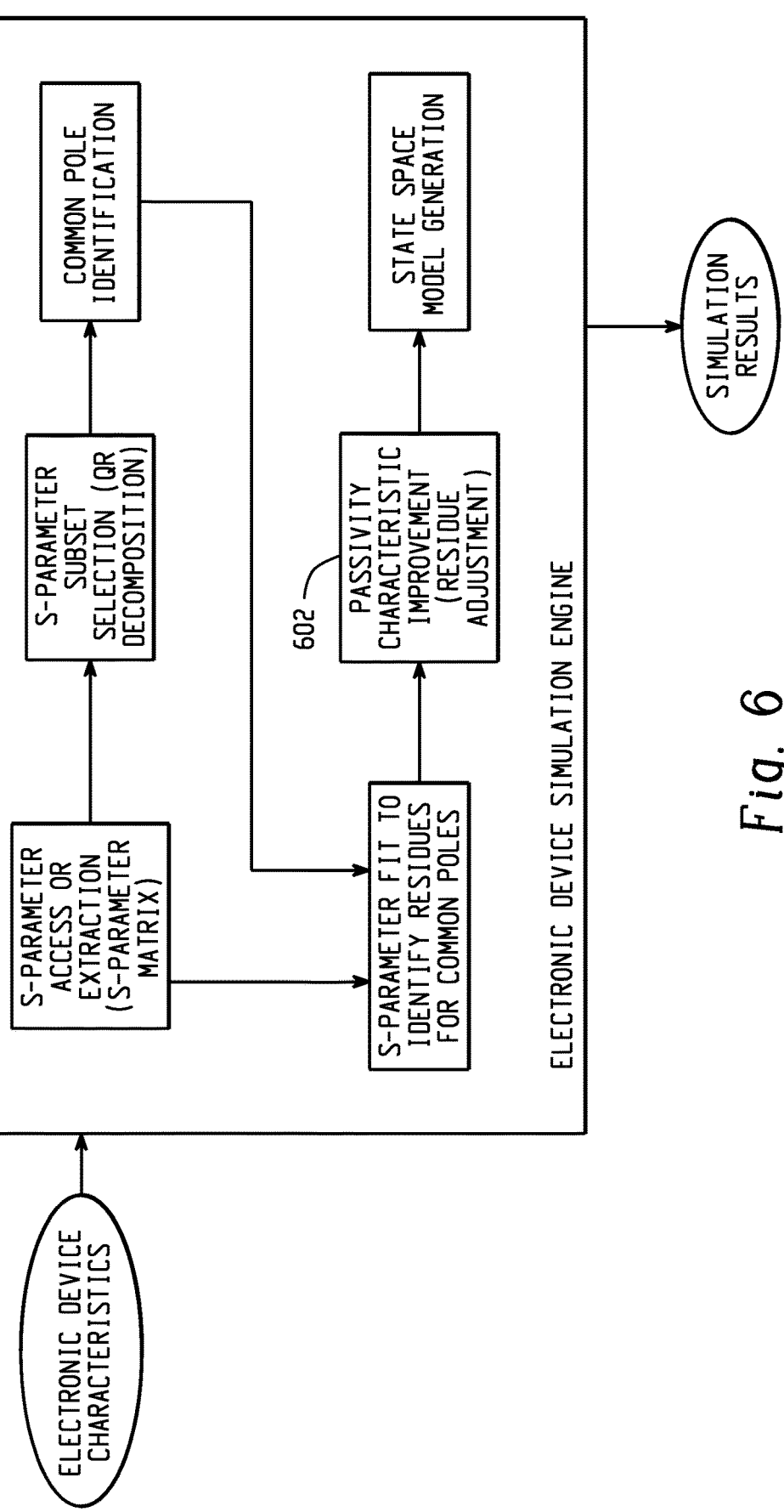
FIG. 6 is a flow diagram depicting a method for generating a model, where results from the S-parameter fitting are adjusted at to improve passivity characteristics of the model.

The port-to-port response fitting is an inexact science, which can often be improved via adjustment of fitting parameters or post-fitting adjustment of the results. One flaw of some fitting operations is a violation of a passivity condition. Specifically, in a passive system, the energy observed at the output port should be no greater than the energy input at the input port. At times, the simulation techniques described herein can result in a model that violates this condition. FIG. 6 is a flow diagram depicting a method for generating a model, where results from the S-parameter fitting are adjusted at 602 to improve passivity characteristics of the model. In one example, the resulting model can be adjusted in an attempt to reduce the passivity condition violation while minimizing detrimental effects on quality of fit (e.g., adjust the model to reduce passivity violations without decreasing fit quality beyond a threshold level), such as is described with reference to FIG. 3 of U.S. patent application Ser. No. 13/763,273, filed Feb. 8, 2013, entitled "Enhancements to Parameter Fitting and Passivity Enforcement," incorporated by reference in its entirety herein above.

Figure 7:
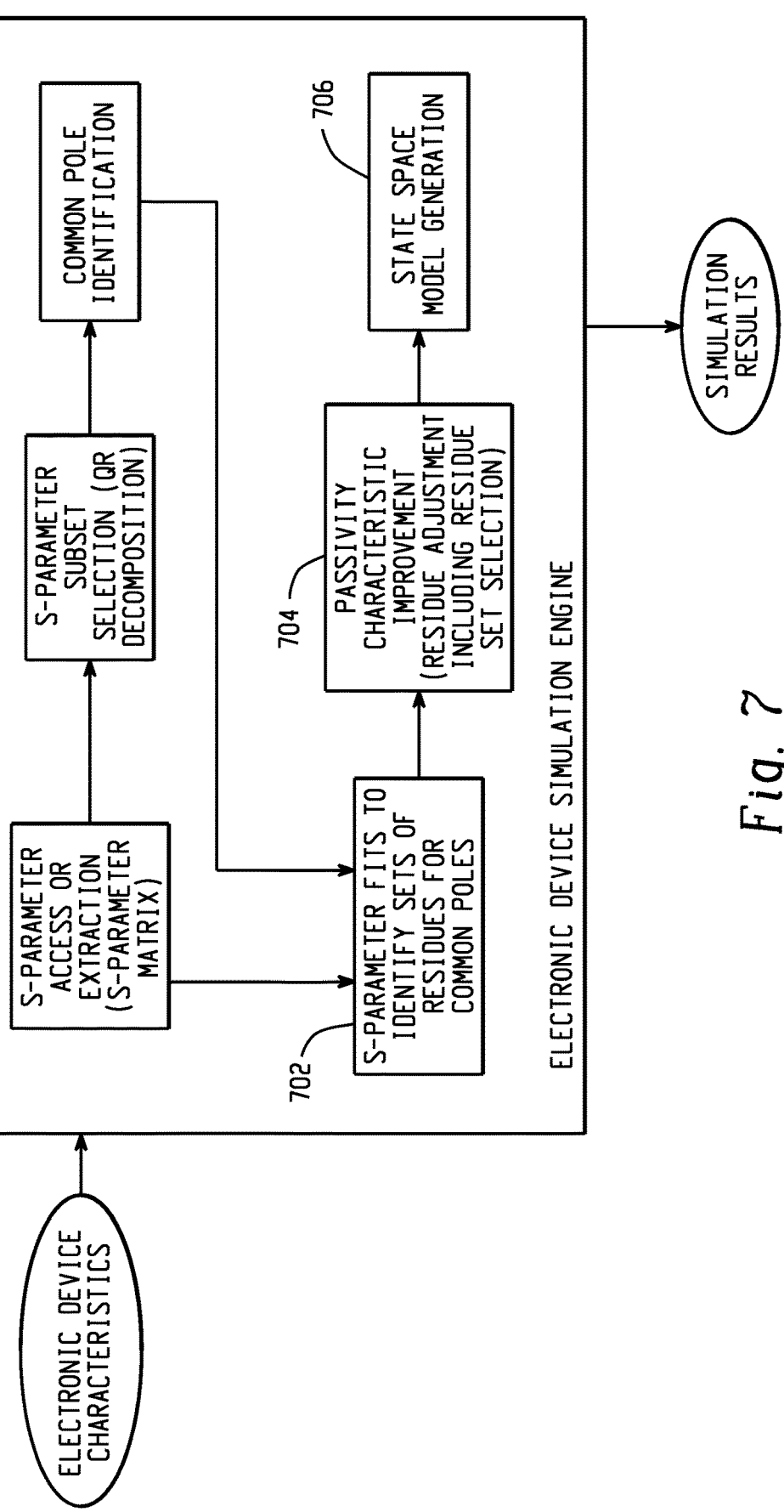
FIG. 7 is a flow diagram depicting a method for generating a model, where one of multiple S-parameter fits is selected for passivity characteristic improvement and model generation.

While that algorithm is useful in improving passivity characteristics of a model, performance of the algorithm can be improved though improvement of the starting point of the algorithm. FIG. 7 is a flow diagram depicting a method for generating a model, where one of multiple S-parameter fits is selected for passivity characteristic improvement and model generation. In the example of FIG. 7, multiple port-to-port frequency response fits are performed at 702. In one example, four fits are generated as follows:

(1) No sensitivity-based weighting and no regularization in least-squares algorithm for transfer function fitting;
(2) No sensitivity-based weighting, default regularization in least-squares algorithm for transfer function fitting;
(3) Sensitivity-based weighting using condition number estimates, default regularization in least-squares algorithm for transfer function fitting; and
(4) Sensitivity-based weighting using test-fit error rations, default regularization in least-squares algorithm for transfer function fitting.

Each of these fits are analyzed to determine a quality metric, with the fit having the most attractive quality metric is selected for passivity characteristic improvement at 704 and model generation at 706. In one example, the quality metric is based on a weighted sum of a plurality of fit characteristics. In one example, the fit characteristics are:
(1) Distance from passivity, $\max(0, \max_{ftest}\|S_{fit}(f_{test})\|_2 - 1)$;
(2) Error in S, $\|S_{fit}-S\|$; and
(3) Error in Z, $\|Z_{fit}-Z\|$.

Figure 8:
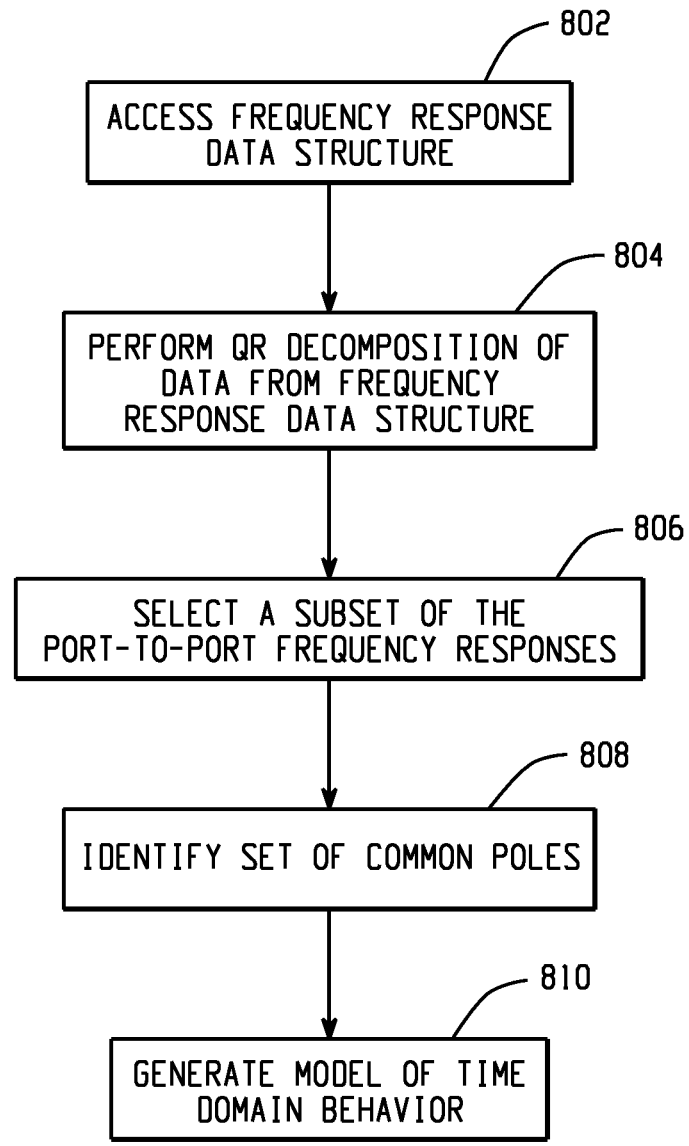
FIG. 8 is a flow diagram depicting example steps of a method of simulating an electrical characteristic of an electronic device having input ports and output ports.

FIG. 8 is a flow diagram depicting example steps of a method of simulating an electrical characteristic of an electronic device having input ports and output ports. At 802, a device frequency response data structure is accessed that contains data associated with a plurality of port-to-port frequency responses of the electronic device, each port-to-port frequency response being associated with a plurality of frequencies. At 804, a QR decomposition is performed based on data from the frequency response data structure. At 806, a subset of the port-to-port frequency responses is selected based on the QR decomposition. At 808, a set of common poles is identified using the selected subset of port-to-port frequency responses, and at 810, a model of time domain behavior of the electronic device is generated using the set of common poles.

This application uses examples to illustrate the invention. The patentable scope of the invention includes other examples.

It is claimed:

1. A computer-implemented method of simulating an electrical characteristic of a physical electronic device structure being simulated and having p input ports and p output ports, comprising:
   accessing a device frequency response data structure that contains data associated with a plurality of port-to-port frequency responses of the physical electronic device structure, each port-to-port frequency response being associated with a plurality of frequencies;
   identifying $p^2$ transfer functions between the p input and the p output ports, each transfer function characterized by the plurality of frequencies, wherein p is an integer value;
   performing a QR decomposition based on a representation of the $p^2$ transfer functions;
   selecting a subset of the port-to-port frequency responses capable of characterizing all of the port-to-port frequency responses based on the QR decomposition, the subset including less than all of the port-to-port frequency responses;
   identifying a set of common poles using the selected subset of port-to-port frequency responses;
   generating a model of time domain behavior of the physical electronic device structure using the set of common poles and estimated residues for the common poles; and
   simulating an electrical characteristic of the physical electronic device structure using the model of time domain behavior, wherein the electrical characteristic comprises voltages, currents, and electromagnetic fields at the input ports and output ports of the physical electronic device structure;
   wherein the residues are estimated by:
      performing a first fitting operation and a second fitting operation using the port-to port frequency responses;
      determining a first quality metric based on the first fitting operation and a second quality metric based on the second fitting operation; and
      selecting results of one of the first fitting operation and the second fitting operation as an input for the estimated residues, the selecting being based on the first quality metric and the second quality metric.

2. The method of claim 1, further comprising: adjusting the estimated residues to improve a passivity characteristic of the model.

3. The method of claim 2, wherein the estimated residues are adjusted to force the passivity characteristic to comply with a passivity threshold.

4. The method of claim 3, wherein the residues are estimated based on a fitting operation using the port-to-port frequency responses of the electronic device; wherein the method further comprises:
   calculating a quality of fit metric for the fitting operation, wherein the estimated residues are adjusted to improve the passivity characteristic of the model without the quality of fit metric violating a quality threshold.

5. The method of claim 1, wherein the residues are estimated based on a fitting operation using the port-to-port frequency responses of the electronic device.

6. The method of claim 5, further comprising: using a result of the fitting operation to determine a characteristic matrix of the electrical circuit.

7. The method of claim 6, wherein the characteristic matrix is an impedance matrix or an admittance matrix.

8. The method of claim 6, wherein the fitting operation comprises determining a fit for each port-to-port frequency response of the electronic device represented in the device frequency response data structure; wherein each fit meets a fit quality threshold.

9. The method of claim 8, wherein each port-to-port frequency response is associated with a response fit quality threshold, wherein the fit for a particular fit for a particular port-to-port frequency response at least meets the response fit quality threshold associated with that particular port-to-port frequency response.

10. The method of claim 9, wherein the response fit quality threshold for a particular port-to-port frequency response is based on a sensitivity of the characteristic matrix to errors in the fit for the particular port-to-port frequency response.

11. The method of claim 10, wherein the fit quality threshold for the particular port-to-port frequency response requires a better fit for the particular port-to-port frequency response as the sensitivity of the characteristic matrix increases.

12. The method of claim 10, wherein the fit quality threshold for the particular port-to-port frequency response is based on a condition number calculation.

13. The method of claim 10, wherein the fit quality threshold for the particular port-to-port frequency response is based on a test fit of the particular port-to-port frequency response.

14. The method of claim 1, wherein the first quality metric is based on one or more of a passivity of results of the first fitting operation, an S-error of the results of the first fitting operation, and a 2-error of the results of the first fitting operation.

15. The method of claim 14, wherein the first quality metric is based on a weighted sum of a plurality of quality metrics.

16. The method of claim 1, wherein the first fitting operation is based on a first set of parameters, and wherein the second fitting operation is based on a second set of parameters having at least one parameters that differs from a corresponding parameter in the first set of parameters.

17. The method of claim 16, wherein the first set of parameters includes one or more of a sensitivity based weighting indicator, a least-squares regularization metric, and a sensitivity weighting metric.

18. The method of claim 1, further comprising using the model to simulate the electrical characteristic of the electronic device and storing the electrical characteristic in a computer-readable memory.

19. A system for simulating an electrical characteristic of a physical electronic device structure being simulated and having p input ports and p output ports, comprising:
   a central processing unit; and
   memory storing instructions for execution by the central processing unit to result in operations comprising:
      accessing a device frequency response data structure that contains data associated with a plurality of port-to-port frequency responses of the physical electronic device structure, each port-to-port frequency response being associated with a plurality of frequencies;
      identifying $p^2$ transfer functions between the p input and the p output ports, each transfer function characterized by the plurality of frequencies, wherein p is an integer value;
      performing a QR decomposition based on a representation of the $p^2$ transfer functions;
      selecting a subset of the port-to-port frequency responses capable of characterizing all of the port-to-port frequency responses based on the QR decomposition, the subset including less than all of the port-to-port frequency responses;
      identifying a set of common poles using the selected subset of port-to-port frequency responses;
      generating a model of time domain behavior of the physical electronic device structure using the set of common poles and estimated residues for the common poles; and
      simulating an electrical characteristic of the physical electronic device structure using the model of time domain behavior, wherein the electrical characteristic comprises the voltages, currents, and electromagnetic fields at the input ports and output ports of the physical electronic device structure;
      wherein the residues are estimated by:
         performing a first fitting operation and a second fitting operation using the port-to port frequency responses;
         determining a first quality metric based on the first fitting operation and a second quality metric based on the second fitting operation; and
         selecting results of one of the first fitting operation and the second fitting operation as an input for the estimated residues, the selecting being based on the first quality metric and the second quality metric.

20. A computer program product for simulating an electrical characteristic of a physical electronic device structure being simulated and having p input ports and p output ports, the computer program product comprising non-tangible media storing instructions, which when executed by at least one central processing unit, result in operations comprising:
   accessing a device frequency response data structure that contains data associated with a plurality of port-to-port frequency responses of the physical electronic device structure, each port-to-port frequency response being associated with a plurality of frequencies;
   identifying $p^2$ transfer functions between the p input and the p output ports, each transfer function characterized by the plurality of frequencies, wherein p is an integer value;
   performing a QR decomposition based on a representation of the $p^2$ transfer functions;
   selecting a subset of the port-to-port frequency responses capable of characterizing all of the port-to-port frequency responses based on the QR decomposition, the subset including less than all of the port-to-port frequency responses;
   identifying a set of common poles using the selected subset of port-to-port frequency responses;
   generating a model of time domain behavior of the physical electronic device structure using the set of common poles and estimated residues for the common poles; and
   simulating an electrical characteristic of the physical electronic device structure using the model of time domain behavior, wherein the electrical characteristic comprises the voltages, currents, and electromagnetic fields at the input ports and output ports of the physical electronic device structure;
   wherein the residues are estimated by:
      performing a first fitting operation and a second fitting operation using the port-to port frequency responses;
      determining a first quality metric based on the first fitting operation and a second quality metric based on the second fitting operation; and
      selecting results of one of the first fitting operation and the second fitting operation as an input for the estimated residues, the selecting being based on the first quality metric and the second quality metric.

\* \* \* \* \*